(12) United States Patent
Shin

(10) Patent No.: US 8,344,771 B2
(45) Date of Patent: Jan. 1, 2013

(54) DELAY LOCKED LOOP OF SEMICONDUCTOR INTEGRATED CIRCUIT AND METHOD FOR DRIVING THE SAME

(75) Inventor: Dong-Suk Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 136 days.

(21) Appl. No.: 12/938,081

(22) Filed: Nov. 2, 2010

(65) Prior Publication Data

US 2011/0267118 A1 Nov. 3, 2011

(30) Foreign Application Priority Data

Apr. 28, 2010 (KR) ........................ 10-2010-0039433

(51) Int. Cl.
*H03L 7/06* (2006.01)
(52) U.S. Cl. .................. 327/156; 375/373; 327/159
(58) Field of Classification Search .................. 327/156, 327/158, 159; 375/373
See application file for complete search history.

(56) References Cited

U.S. PATENT DOCUMENTS

| | | | | |
|---|---|---|---|---|
| 7,683,684 B2* | 3/2010 | Lee et al. | ....................... | 327/158 |
| 7,719,333 B2* | 5/2010 | Yun et al. | ....................... | 327/158 |
| 7,724,050 B2* | 5/2010 | Lee | ................................ | 327/158 |
| 7,868,673 B2* | 1/2011 | Lee et al. | ....................... | 327/158 |
| 7,948,289 B2* | 5/2011 | Choi | ............................ | 327/158 |
| 8,154,326 B2* | 4/2012 | Yun et al. | ....................... | 327/149 |
| 2002/0015460 A1* | 2/2002 | Bhullar et al. | ................. | 375/371 |
| 2005/0249027 A1* | 11/2005 | Kwak | ........................... | 365/233 |
| 2009/0167388 A1* | 7/2009 | Lee | ................................ | 327/158 |
| 2010/0134155 A1* | 6/2010 | Lee et al. | ....................... | 327/143 |
| 2010/0213920 A1* | 8/2010 | Yun et al. | ....................... | 323/318 |
| 2010/0295588 A1* | 11/2010 | Choi | ............................ | 327/158 |

FOREIGN PATENT DOCUMENTS

KR 1020090071892 7/2009

* cited by examiner

*Primary Examiner* — Ryan Jager
(74) *Attorney, Agent, or Firm* — IP & T Group LLP

(57) ABSTRACT

A delay locked loop (DLL) of a semiconductor integrated circuit includes a first delay line configured to variably delay a source clock signal and output a locked clock signal, a phase comparator configured to compare the phase of the source clock signal with the phase of a feedback clock signal, a second delay line configured to variably delay the locked clock signal, a first delay controller configured to control the first delay time of the first delay line, a second delay controller configured to control the minimum delay time of the second delay line, and an operation mode controller configured to control the first and second delay controllers in response to an output signal of the phase comparator, and switch operation modes of the first and second delay controllers depending on locking state of the delay lines.

13 Claims, 6 Drawing Sheets

$$R \begin{cases} N \cdot Tck = Tdelay + Treplica \\ Treplica = (N-1) \cdot Tck + Textra \\ Textra = Tck - Tdelay \end{cases}$$

DELAY LOCKED LOOP OF SEMICONDUCTOR INTEGRATED CIRCUIT AND METHOD FOR DRIVING THE SAME

CROSS-REFERENCE TO RELATED APPLICATIONS

The present application claims priority of Korean Patent Application No. 10-2010-0039433, filed on Apr. 28, 2010, which is incorporated herein by reference in its entirety.

BACKGROUND OF THE INVENTION

Exemplary embodiments of the present invention relate to semiconductor design technology, and more particularly, to a delay locked loop (DLL) of a semiconductor integrated circuit and a method for driving the same.

In general, semiconductor integrated circuits have been continuously improved to increase the integration degree and the operation speed thereof. A synchronous semiconductor integrated circuit has emerged, which may operate in synchronization with a source clock signal applied from the outside of the semiconductor integrated circuit in order to increase the operation speed. Such a synchronous semiconductor integrated circuit uses a DLL which generates an internal clock signal by delaying the source clock signal by a predetermined period/time so that data may be outputted accurately in synchronization with rising and falling edges of the source clock signal.

As such, the DLL generates the internal dock signal which is obtained by compensating for delay factors inside the semiconductor integrated circuit with respect to the source clock signal. This operation is referred to as locking.

FIG. 1 is a block diagram of a conventional DLL.

Referring to FIG. 1, the DLL 100 includes an input buffer 110, a delay line 120, a replica delay 130, a phase comparator 140, a delay controller 150, and an output buffer 160. The input buffer 110 is configured to receive and buffer a source clock signal EX_CLK and output the buffered clock signal IN_CLK. The delay line 120 is configured to delay the buffered clock signal IN_CLK in response to a control signal CTR and output an operation clock signal IN_CLK'. The replica delay 130 is configured to reflect/apply a modeled delay amount in/to the operation clock signal IN_CLK' outputted from the delay line 120 and output a feedback clock signal FC_CLK. The modeled delay amount is a delay amount which actually occurs in input/output data paths of the system to which the DLL 100 is applied, i.e., a semiconductor integrated circuit. The phase comparator 140 is configured to compare the phase of the buffered clock signal IN_CLK outputted from the input buffer 110 with the phase of the feedback clock signal FD_CLK outputted from the replica delay 130. The delay controller 150 is configured to generate the control signal CTR in response to an output signal of the phase comparator 140. The output buffer 160 is configured to buffer the operation clock signal IN_CLK' outputted from the delay line 120 and output an internal clock signal OUT_CLK to the outside.

While the delay line 120 controls a delay time corresponding to the delay amount reflected in the buffered clock signal IN_CLK in response to the control signal CTR, the replica delay 130 has a predetermined delay amount, that is, the modeled delay amount.

Hereafter, the operation of the DLL 100 having such a configuration is described.

When the source clock signal EX_CLK is buffered by the input buffer 110 and then transferred as the buffered clock signal IN_CLK to the delay line 120, the delay line 120 bypasses the buffered clock signal IN_CLK at first.

In such a state, the replica delay 130 receives the output signal IN_CLK' of the delay line 120, delays the received signal by the delay time corresponding to the modeled delay amount, and outputs the feedback clock signal FD_CLK.

Then, the phase comparator 140 compares the phase of the buffered clock signal IN_CLK outputted from the input buffer 110 with the phase of the feedback clock signal FC_CLK outputted from the replica delay 130. The delay controller 150 generates the control signal CTR in response to the output signal of the phase comparator 140, and outputs the generated control signal CTR to the delay line 120.

Accordingly, the delay line 120 delays the buffered clock signal IN_CLK by the corresponding delay time in response to the control signal CTR, and outputs the delayed signal as the operation clock signal IN_CLK'.

When the above-described series of operations are repeated and the phases of the buffered clock signal IN_CLK and the feedback clock signal FC_CLK are synchronized as the comparison result of the phase comparator 140, the delay amount of the delay line 120 is locked.

Meanwhile, after the delay amount for locking the delay line 120 is decided, an update process may be performed at every period with a desired duration. Since a jitter may occur in the locked operation clock signal IN_CLK' due to noise or the like, the above-described locking process is repetitively performed to compensate for the jitter during the update process.

However, the conventional DLL 100 has the following concerns.

Among the components composing the DLL 100, a control pulse generator (CPG), the delay line 120, and the replica delay 130 occupy most of the power consumption of the DLL 100. The CPG is not illustrated in FIG. 1. Therefore, in order to reduce the power consumption of the DLL 100, the power consumption of the CPG, the delay line 120, and the replica delay 130 needs to be reduced.

However, there is no method for reducing the power consumption in the CPG, except that flip-flops provided therein are replaced with low-power units. Since the number of delay cells provided in the delay line 120 is variable, there are difficulties in reducing the power consumption. Furthermore, since the replica delay 130 has a constant delay amount, there is no method which has been proposed to reduce the power consumption.

FIG. 2 is a graph showing the power consumption of the delay line 120 and the power consumption of the replica delay 130 with respect to a frequency of the source clock signal. Referring to FIG. 2, as the frequency of the source clock signal EX_CLK increases, the number of delay cells used in the delay line 120 decreases. Accordingly, the power consumption of the delay line 120 tends to be constant with respect to the frequency of the source clock signal. However, the power consumption of the replica delay 130 with a constant delay amount tends to increase as the frequency of the source clock signal EX_CLK increases. Therefore, it can be seen that the total power consumption of the DLL 100 also increases as the frequency of the source clock signal EX_CLK increases.

Hence, there is a demand for a DLL which is capable of adaptively optimizing the power consumption according to the frequency of the source clock signal.

SUMMARY OF THE INVENTION

Exemplary embodiments of the present invention are directed to a DLL of a semiconductor integrated circuit, which is capable of minimizing power consumption of a replica delay even though the frequency of a source clock signal increases, and a method for driving the same.

In accordance with an exemplary embodiment of the present invention, a DLL of a semiconductor integrated circuit includes: a first delay line configured to delay a source clock signal by a first delay time taken for a locking state and output a locked clock signal; a phase comparator configured to compare the phase of the source clock signal with the phase of a feedback clock signal; a second delay line configured to, before the locking state of the first delay line, delay the locked clock signal by a second delay time obtained by modeling a delay amount of an internal circuit and, after the locking state of the first delay line, delay the locked clock signal by a minimum delay time to maintain the locking state of the first delay line and configured to provide the delayed signal as the feedback clock signal; a first delay controller configured to control the first delay time of the first delay line; a second delay controller configured to control the minimum delay time of the second delay line; and an operation mode controller configured to control the first and second delay controllers in response to an output signal of the phase comparator, and switch operation modes of the first and second delay controllers depending on the locking state of the first delay line.

In accordance with another exemplary embodiment of the present invention, there is provided a method for driving a DLL of a semiconductor integrated circuit, the DLL including a first delay line configured to variably delay a source clock signal and output a locked clock signal and a second delay line configured to feed back the locked clock signal as a feedback clock signal. The method includes: tracking a delay time taken for locking the first delay line by using the feedback clock signal, in a state in which a delay amount of the second delay line is fixed corresponding to a delay time obtained by modeling delays of an internal circuit; and tracking a minimum delay time taken for locking the second delay line by using the locked clock signal, in a state in which the delay time taken for locking the first delay line is tracked.

In accordance with further exemplary embodiment of the present invention, a DLL of a semiconductor integrated circuit includes: a first delay line configured to delay a source clock signal by a delay amount to output a delayed clock signal, the delay amount varying in response to a first control signal; a second delay line configured to delay the delayed clock signal by a constant delay amount or a variable delay amount according to an locking state of the first delay line to output a feedback clock signal, the variable delay amount varying in response to a second control signal; a phase comparator configured to compare the phase of the source clock signal with the phase of the feedback clock signal; and a controller configured to control operations of the first and second delay lines by outputting the first and second control signals in response to an output signal of the phase comparator.

DESCRIPTION OF SPECIFIC EMBODIMENTS

Figure 1:
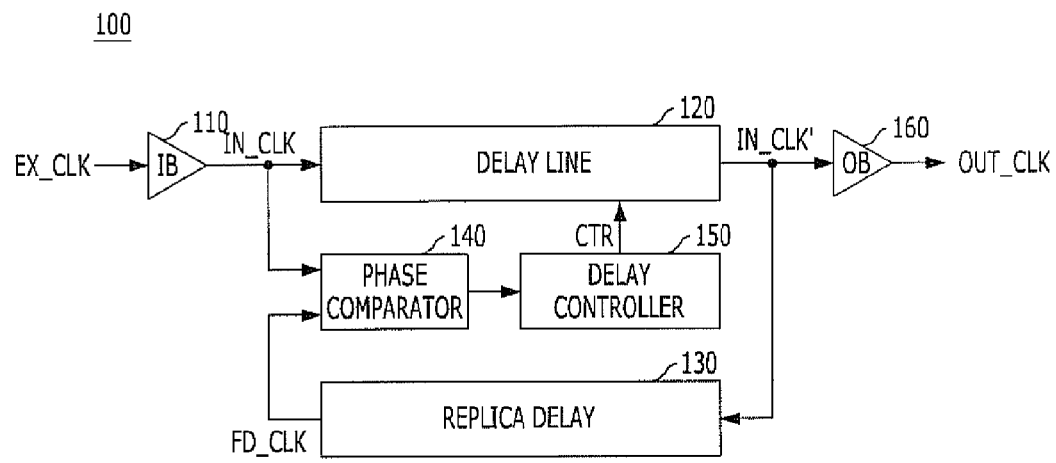
FIG. 1 is a block diagram of a conventional DLL.
Figure 2:
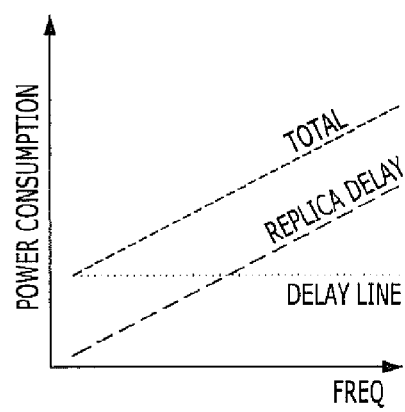
FIG. 2 is a graph showing the power consumption of a delay line and the power consumption of a replica delay with respect to a frequency of a source clock signal in the DLL of FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
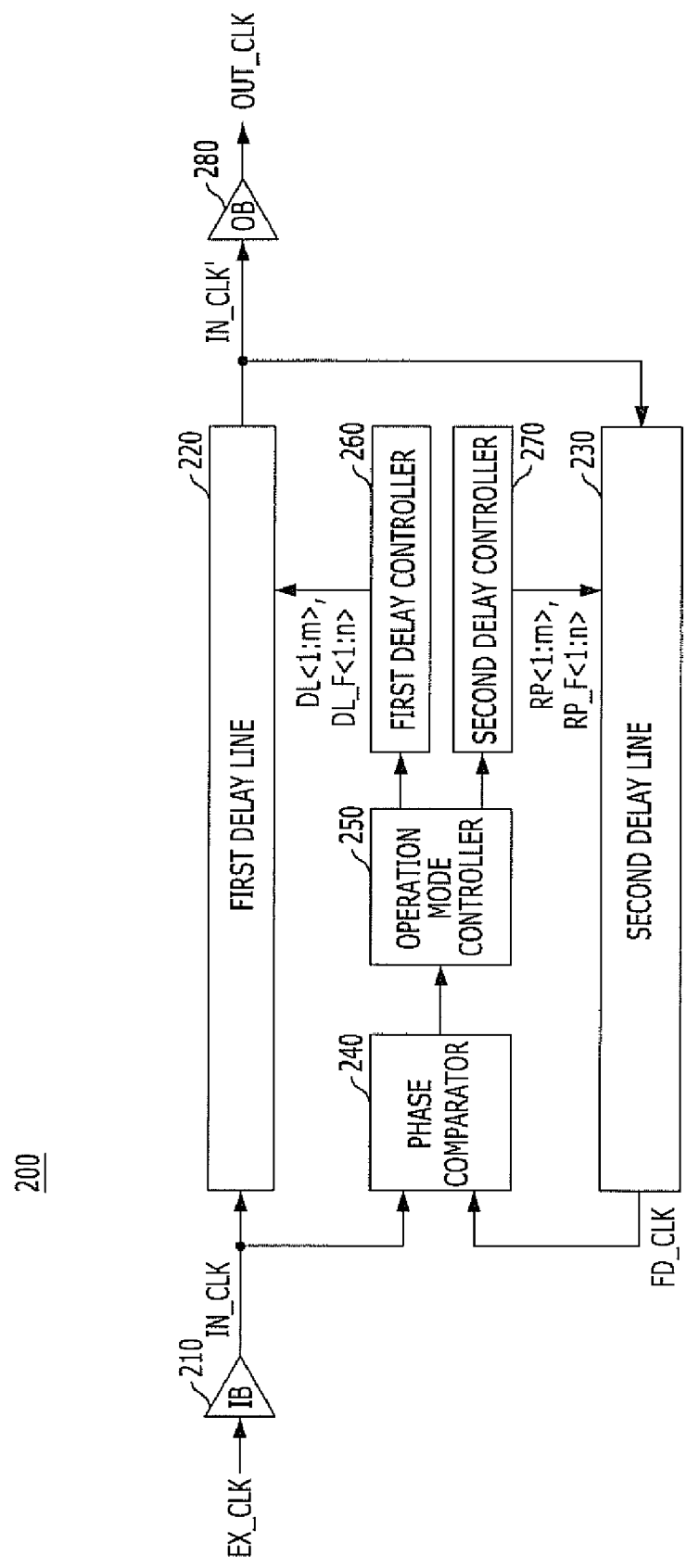
FIG. 3 is a block diagram of a DLL of a semiconductor integrated circuit in accordance with an embodiment of the present invention.

FIG. 3 illustrates a DLL of a semiconductor integrated circuit in accordance with an embodiment of the present invention.

Referring to FIG. 3, the DLL 200 includes an input buffer 210, a first delay line 220, a second delay line 230, a phase comparator 240, an operation mode controller 250, a first delay controller 260, a second delay controller 270, and an output buffer 280.

The input buffer 210 is configured to receive and buffer an external source clock signal EX_CLK and generate the buffered clock signal IN_CLK.

The first delay line 220 is configured to delay the buffered clock signal IN_CLK outputted from the input buffer 210 by a delay time corresponding to a first control signal DL<1:m>/DL_F<1:n> and output an operation clock signal IN_CLK'.

The second delay line 230 is configured to delay the operation clock signal IN_CLK' outputted from the first delay line 220 by a delay time corresponding to a delay amount obtained by modeling the delay of an internal circuit and provide the delayed signal as a feedback clock signal FC_CLK, before the first delay line 220 is locked. The internal circuit may indicate internal circuits of the semiconductor integrated circuit, which is not illustrated in FIG. 3. Furthermore, the second delay line 230 is configured to delay the operation clock signal IN_CLK' of the first delay line 220 by a delay time corresponding to the minimum delay amount by which the locking is maintained and provide the delayed signal as a feedback clock signal FC_CLK, after the first delay line 220 is locked. That is, the second delay line 230 variably delays the operation clock signal IN_CLK' according to the locking information. Here, the locking means generating an internal clock signal OUT_CLK obtained by compensating for a delay factor of the semiconductor integrated circuit with respect to the source clock signal EX_CLK.

The phase comparator 240 is configured to compare the phase of the buffered clock signal IN_CLK with the phase of the feedback clock signal FD_CLK. An output signal of the phase comparator 240 includes the locking information of the first delay line 220. In this embodiment of the present invention, it is described that the locking information is provided by the phase comparator 240. Without being limited thereto, however, a locking detector which is configured to receive the output signal of the phase comparator 240 and detect whether the first delay line 220 is locked or not and a CPG which is configured to output the locking information to the operation mode controller 250 in response to an output signal of the locking detector may be further provided. The locking detector and the CPG are not illustrated in FIG. 3.

The operation mode controller 250 is configured to control the first and second delay controllers 260 and 270 in response to the output signal of the phase controller 240 and switch the respective operation modes of the first and second delay controllers 260 and 270 according to the locking information. When the locking information includes pre-locking information, the operation mode controller 250 controls the first delay controller 260 to operate in a variable mode and controls the second delay controller 270 to operate in a fixed mode. Furthermore, when the locking information includes post-locking information, the operation mode controller 250 controls the first delay controller 260 to operate in the fixed mode and controls the second delay controller 270 to operate in the variable mode.

The first delay controller 260 is configured to generate the first control signal DL<1: n>/DL_F<1: n> according to the control of the operation mode controller 250 and control the delay time of the first delay line 220. The second delay controller 270 is configured to generate a second control signal RP<1: m>/RP_F<1: n> according to the control of the operation mode controller 250 and control the delay time of the second delay line 230. The first and second delay controllers 260 and 270 generate the first and second control signals DL<1: m>/DL_F<1: n> and RP<1:m>/RP_F<1:n> corresponding to the comparison result of the phase comparator 240 according to the mode control of the operation mode controller 250. The first and second delay controllers 260 and 270 may include a counter or shift register.

The output buffer 280 is configured to buffer the operation clock signal IN_CLK' outputted from the first delay line 220 and output the buffered signal as an internal clock signal OUT_CLK.

Figure 4:
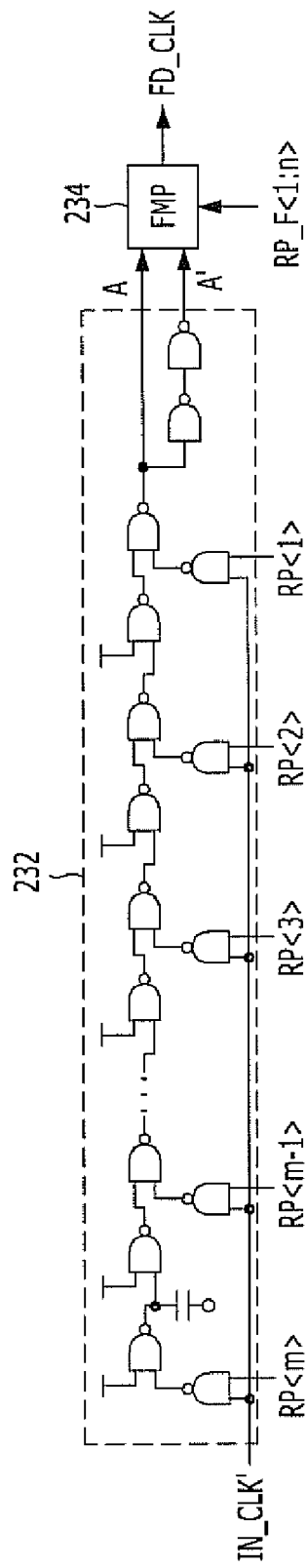
FIG. 4 is an internal configuration diagram of a second delay line of FIG. 3.

FIG. 4 is an internal configuration diagram of the second delay line 230 of FIG. 3.

Referring to FIG. 4, the second delay line 230 includes a dual coarse delay line (DCDL) 232 and a fine phase mixer (FPM) 234.

The DCDL 232 is configured to control the delay time of the operation clock signal IN_CLK' by controlling the number of delay elements, that is, the number of AND gates which the operation clock signal IN_CLK' passes through, in response to the second control signal RP<1:m> outputted from the second delay controller 270. The DCDL 232 outputs the controlled operation clock signal A and a unit-delayed operation clock signal A' obtained by unit-delaying the controlled operation clock signal A.

Furthermore, the FPM 234 is configured to mix the controlled operation clock signal A and the unit-delayed operation clock signal A' and output one feedback clock signal FC_CLK. For example, the FPM 234 outputs a mixed operation clock signal having its falling edge at a certain position between a falling edge of the controlled operation clock signal A and a falling edge of the unit-delayed operation clock signal A' as the feedback clock signal FC_CLK.

Meanwhile, the first delay line 220 may have the same configuration as the second delay line 230.

Hereafter, a method for driving the DLL of the semiconductor integrated circuit in accordance with the exemplary embodiment of the present invention is described with reference to FIGS. 5 to 7.

Figure 5:
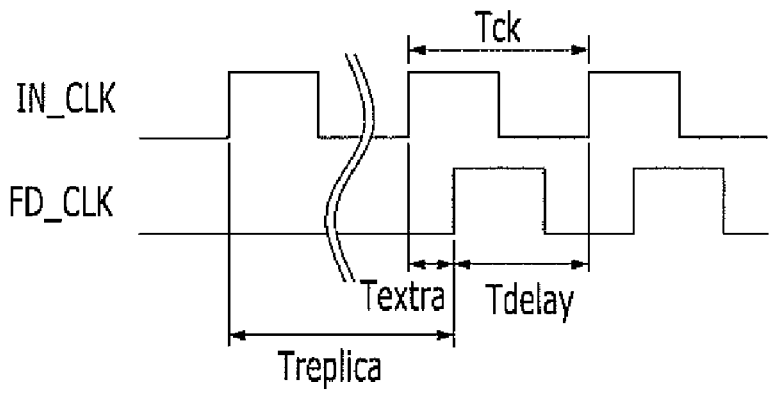
FIG. 5 is a timing diagram illustrating delay times controlled by the DLL of FIG. 3.
Figure 5:
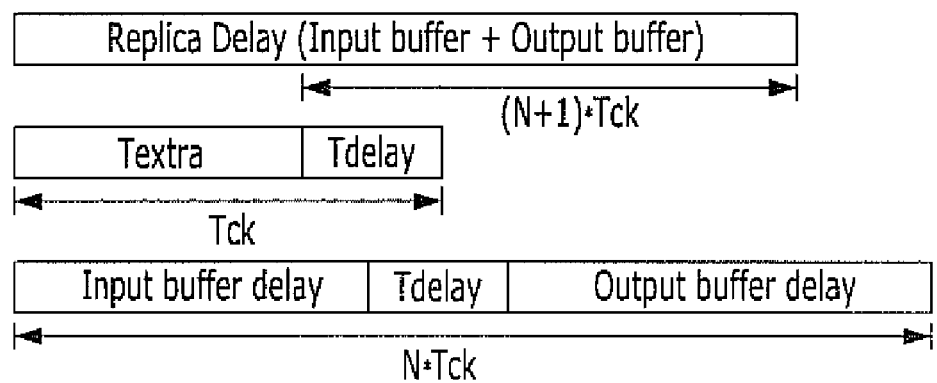

FIG. 5 is a timing diagram illustrating delay times controlled by the DLL of FIG. 3, according to an exemplary embodiment of the present invention in detail before describing the operation of the present invention.

The locking means that the phase of the buffered clock IN_CLK inputted to the first delay line 220 is synchronized with the phase of the feedback clock signal FC_CLK outputted from the second delay line 230. Therefore, when the feedback clock FD_CLK to which a modeled delay time Treplica applied by the second delay line 230 is further delayed by a delay time Tdelay to be synchronized with the buffered clock signal IN_CLK, the locking is finally completed. Herein, the modeled delay time Treplica indicates a delay time until the source clock signal EX_CLK is inputted to the first delay line 220 through the input buffer 210 and a delay time until the operation clock signal IN_CLK' outputted from the first delay line 220 is outputted to the outside through the output buffer 280. Hereafter, the delay time Tdelay for locking the buffered clock signal IN_CLK by the first delay line 220 is referred to a first delay time, and the modeled delay time Treplica is referred to a second delay time.

Therefore, between the first delay time Tdelay and the second delay time Treplica, equations denoted by R of FIG. 5 are established. That is, the sum of the first delay time Tdelay and the second delay time Treplica is equal to 'N*Tck', where N represents a natural number larger than one and Tck represents a period of the source clock signal EX_CLK. In particular, a delay time Textra is a minimum delay time corresponding to the second delay time Treplica regardless of a frequency of the source clock signal EX_CLK, which is obtained by 'Tck−Tdelay'. Hereafter, the delay time Textra is referred to as a third delay time. For reference, the first delay time Tdelay is set to less than 1 Tck, and the second delay time Treplica may more than 1 Tck depending on the design.

In the exemplary embodiment of the present invention, the first delay time Tdelay is determined in consideration of the second delay time Treplica at first tracking step, and the second delay time Treplica is then controlled to the third delay time Textra at second tracking step. When the delay time is reduced from the second delay time Treplica to the third delay time Textra, it means that the delay amount of the second delay line 230, that is, the number of enabled delay elements, is reduced. Therefore, power consumed by the second delay line 230 at a subsequent operation, for example, an update step, is reduced in comparison with the conventional semiconductor integrated circuit. The power consumption may be more reduced at a higher frequency of the source clock signal.

Figure 6A:
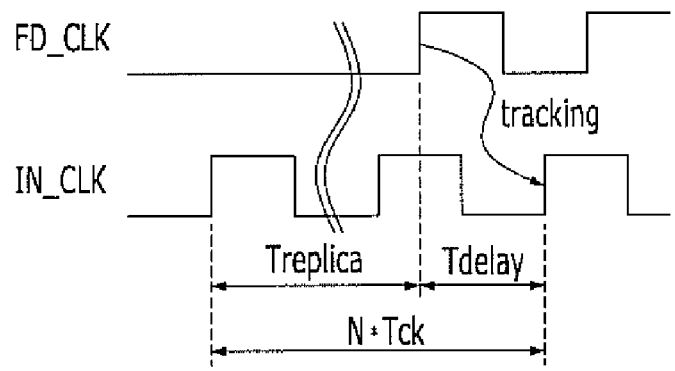
FIGS. 6A to 6C are timing diagrams illustrating a method for driving the DLL of the semiconductor integrated circuit in accordance with the embodiment of the present invention.
Figure 6B:
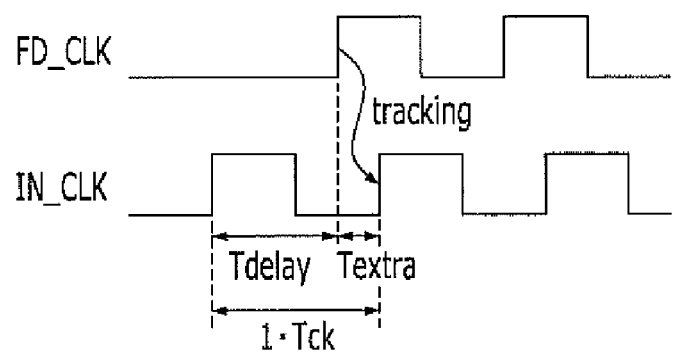
Figure 6C:
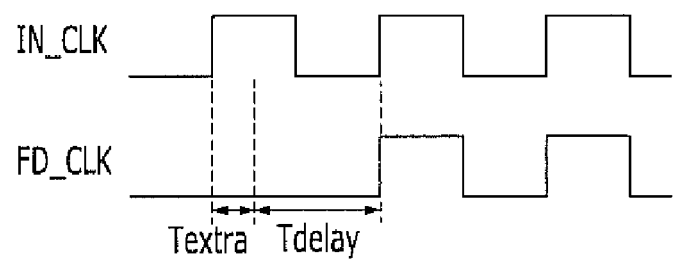
Figure 7:
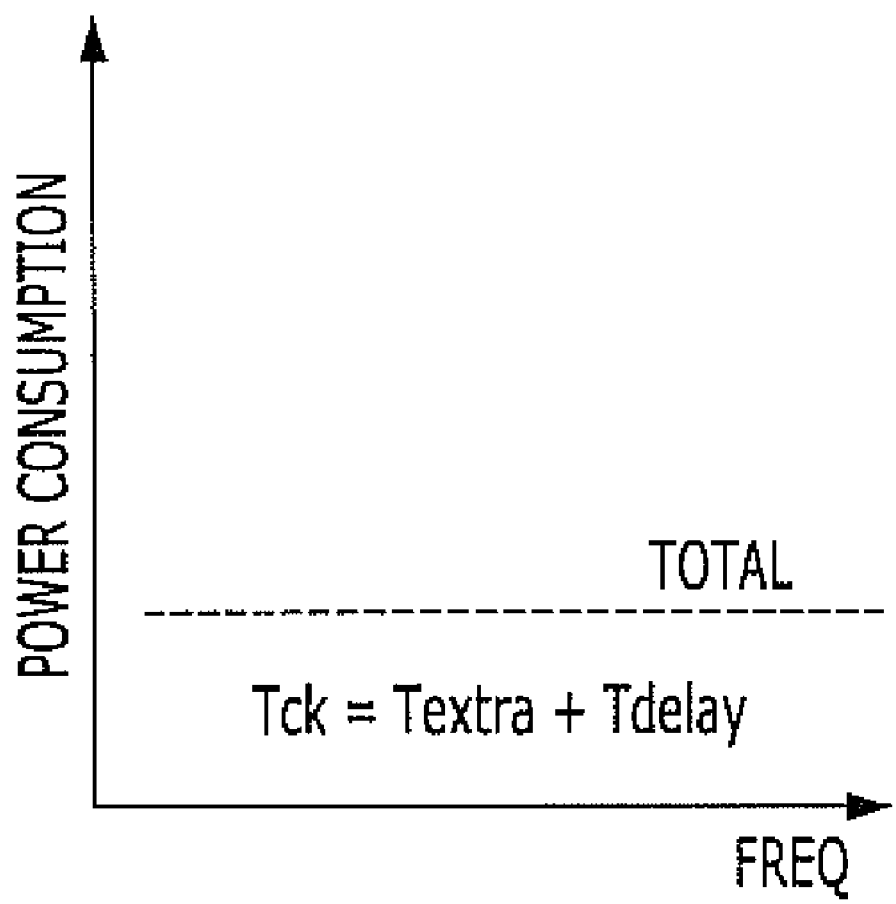
FIG. 7 is a graph showing the power consumption of a first delay line and the power consumption of a second delay line with respect to a frequency of a source clock signal in accordance with the embodiment of the present invention.

FIGS. 6A to 6C are timing diagrams illustrating the method for driving the DLL of the semiconductor integrated circuit in accordance with the embodiment of the present invention.

FIG. 6A is a timing diagram explaining the first tracking step, FIG. 6B is a timing diagram explaining the second tracking step, and FIG. 6C is a timing diagram explaining the update process.

Referring to FIG. 6A, when the DLL 200 is initially driven, the input buffer 210 receives and buffers the source clock signal EX_CLK and then outputs the buffered clock signal IN_CLK to the first delay line 220. At the initial operation, a default value is set in the first delay line 220 for its delay amount. In the exemplary embodiment of the present invention, the default value of the delay amount is set to '0', in convenience for explanation. That is, at the initial operation, the buffered clock signal IN_CLK passes through the first delay line 220 without any delay and is transferred to the second delay line 230.

The second delay line 230 delays the operation clock signal IN_CLK' transferred through the first delay line 220 by the second delay time Treplica and outputs the delayed signal as a feedback clock signal FD_CLK. At the initial operation, the second delay time Treplica is set to a default value for the delay amount of the second delay line 220.

The phase comparator 240 compares a rising edge of the buffered clock signal IN_CLK with a rising edge of the feedback clock signal FC_CLK. At this time, an output signal from the phase comparator 240 includes locking information.

The operation mode controller 250 determines whether the first delay line 220 is locked or not, in response to the output signal of the phase comparator 240, and controls the operation modes of the first and second delay controllers 260 and 270. That is, the operation mode controller 250 controls the first delay controller 260 to operate in the variable mode and controls the second delay controller 270 to operate in the fixed mode, in response to the output signal of the phase comparator 240.

Accordingly, the first delay controller 260 outputs the first control signal DL<1: m>/DL_F<1: n> to the first delay line 220 in correspondence to the comparison result of the phase comparator 240 according to the variable mode. Meanwhile, the second delay controller 270 outputs the second control signal RP<1: m>/RP_F<1:n> corresponding to the fixed mode to the second delay line 230.

The delay amount of the first delay line 220 is controlled by the first control signal DL<1:m>/DL_F<1: n>, and the first delay line 220 delays the buffered clock signal IN_CLK outputted from the input buffer 210 by a delay time corresponding to the controlled delay amount and outputs the operation clock signal IN_CLK'.

The above-described series of operations are repetitively performed for the feedback clock signal FD_CLK to track the buffered clock signal IN_CLK. Accordingly, when the rising edge of the feedback clock signal FD_CLK is synchronized with the rising edge of the buffered clock signal IN_CLK, the locking of the first delay line 220 is completed. Therefore, the locking time (Treplica+Tdelay) of the DLL 200 becomes 'N*Tck' where N represents a natural number larger than one and Tck represents a period of the source clock signal EX_CLK.

Referring to FIG. 6B, the second tracking step for locking the second delay line 230 is performed in such a state that the first tracking step for locking the first delay line 220 is completed.

More specifically, the operation mode controller 250 detects that the first delay line 220 is locked according to the output signal (locking information) of the phase comparator 240, controls the first delay controller 260 to operate in the fixed mode, and controls the second delay controller 270 to operate in the variable mode.

Then, the delay amount of the second delay line 230 is initialized. That is, the delay amount of the second delay line 230 is varied into '0', and the operation clock signal IN_CLK' outputted from the first delay line 220 passes through the second delay line 230 without any delay and is outputted as the feedback clock signal FD_CLK. At this time, since the operation clock signal IN_CLK' is a signal which is delayed by the first delay time Tdelay by the locked first delay line 220, the feedback clock signal FD_CLK is also outputted as a signal delayed by the first delay time Tdelay.

The phase comparator 240 compares the rising edge of the buffered clock signal IN_CLK with the rising edge of the feedback clock signal FD_CLK.

The second delay controller 270 outputs the second control signal RP<1: m>/RP_F<1: n> to the second delay line 230 in correspondence to the comparison result of the phase comparator 240.

The delay amount of the second delay line 230 is controlled by the second control signal RP<1: m>/RP_F<1:n>, and the second delay line 230 delays the operation clock signal IN_CLK' outputted from the first delay line 220 by the delay time corresponding to the controlled delay amount and then outputs the delayed signal as the feedback clock signal FD_CLK.

The above-described series of operations are repetitively performed for the feedback clock signal FD_CLK to the buffered clock signal IN_CLK. Accordingly, when the rising edge of the feedback clock signal FD_CLK is synchronized with the rising edge of the buffered clock signal IN_CLK, the locking of the second delay line 230 is completed. Therefore, the delay amount of the second delay line 230 is controlled from the second delay time Treplica to the third delay time Textra. At this time, the locking time (Tdelay+Textra) of the DLL 200 becomes '1*Tck'.

Referring to FIG. 6C, after the second tracking step for locking the second delay line 230 is completed, the first delay controller 260 operates in the variable mode and the second delay controller 270 operates in the fixed mode, according to the control of the operation mode controller 250. Furthermore, in order to constantly maintain the locking of the first delay line 220, the update step is performed at every period with a desired duration. The update step is performed to prepare for a case in which the locked delay amount of the first delay line 220 is unintendedly varied by noise. When the phases of the buffered clock signal IN_CLK and the feedback clock signal FD_CLK are compared and a difference therebetween occurs as the comparison result, the delay amount of the first delay line 220 is controlled to maintain the current locking state. If the update step is periodically performed, a jitter may not occur in the internal clock signal OUT_CLK of the DLL 200.

At the update step, the second delay line 230 is controlled to have an optimal delay amount, that is, the third delay time Textra.

In such a state, the power consumption for the operation of the second delay line 230 is minimized. Referring to FIG. 7, as the power consumption of the second delay line 230 is constantly maintained even though the frequency of the source clock signal EX_CLK increases, the total power consumption of the DLL 200 is also constantly maintained.

In accordance with the exemplary embodiment of the present invention, the delay amount of the second delay line 230 is optimally controlled after the locking of the DLL 200 is completed. Therefore, the power consumption of the second DLL 230 is adaptively minimized according to the frequency of the source clock.

In accordance with the exemplary embodiment of the present invention, the second delay line of which the delay amount may be controlled is provided instead of the replica delay having a fixed delay amount. Therefore, although the frequency of the source clock signal increases, the delay amount of the second delay line is controlled in correspondence to the increase of the frequency. Accordingly, the power consumption of the second delay line tends to be constant even though the frequency increases, which may minimize the total power consumption of the DLL.

While the present invention has been described with respect to the specific embodiments, it will be apparent to those skilled in the art that various changes and modifications may be made without departing from the spirit and scope of the invention as defined in the following claims.

For example, the first and second delay lines in accordance with the embodiment of the embodiment of the present invention include the DCDL and the FPM. Without being limited thereto, however, a variety of different modifications may be provided as a configuration for variably delaying an input clock signal and outputting the delayed signal.

What is claimed is:

1. A delay locked loop (DLL) of a semiconductor integrated circuit, comprising:
   a first delay line configured to delay a source clock signal by a first delay time taken for a locking state and output a locked clock signal;
   a phase comparator configured to compare the phase of the source clock signal with the phase of a feedback clock signal;
   a second delay line configured to, before the locking state of the first delay line, delay the locked clock signal by a second delay time obtained by modeling a delay amount of an internal circuit and, after the locking state of the first delay line, delay the locked clock signal by a minimum delay time to maintain the locking state of the first delay line and further configured to provide the delayed signal as the feedback clock signal;
   a first delay controller configured to control the first delay time of the first delay line;
   a second delay controller configured to control the minimum delay time of the second delay line; and
   an operation mode controller configured to control the first and second delay controllers in response to an output signal of the phase comparator, and switch operation modes of the first and second delay controllers depending on the locking state of the first delay line,
   wherein the minimum delay time corresponds to a delay time obtained by subtracting the first delay time from a time corresponding to a period of the source clock signal.

2. The DLL of claim 1, wherein the first delay line comprises a dual coarse delay line (DCDL) and a fine phase mixer (FPM).

3. The DLL of claim 1, wherein the second delay line comprises a dual coarse delay line (DCDL) and a fine phase mixer (FPM).

4. The DLL of claim 1, wherein the first and second delay controllers comprise a counter or shift register.

5. The DLL of claim 1, wherein the operation mode controller controls the first delay controller to operate in a variable mode and controls the second delay controller to operate in a fixed mode, before the locking state of the first delay line.

6. The DLL of claim 5, wherein the operation mode controller controls the first delay controller to operate in the fixed mode and controls the second delay controller to operate in the variable mode, after the locking state of the first delay line.

7. The DLL of claim 6, wherein the operation mode controller controls the first delay controller to operate in the variable mode and controls the second delay controller to operate in the fixed mode, after an locking state of the second delay line.

8. A method for driving a delay locked loop (DLL) of a semiconductor integrated circuit, the DLL including a first delay line configured to variably delay a source clock signal and output a locked clock signal and a second delay line configured to feed back the locked clock signal as a feedback clock signal, the method comprising:

tracking a delay time taken for locking the first delay line by using the feedback clock signal, in a state in which a delay amount of the second delay line is fixed corresponding to a delay time obtained by modeling delays of an internal circuit; and
tracking a minimum delay time of the second delay line for maintaining the locking state of the first delay line by using the locked clock signal, in a state in which the delay time taken for locking the first delay line is tracked,
wherein the minimum delay time corresponds to a delay time obtained by subtracting the delay time for locking the first delay line from a time corresponding to a period of the source clock signal.

9. The method of claim 8, further comprising updating an locking state of the first delay line by reflecting the minimum delay time of the second delay line.

10. The method of claim 8, wherein the tracking of the minimum delay time comprises:
    initializing the fixed delay amount of the second delay line; and
    locking the feedback clock signal of the second delay line to the source clock signal, in a state in which the delay time taken for locking the first delay line is reflected in the feedback clock signal.

11. A delay locked loop (DLL) of a semiconductor integrated circuit, comprising:
    a first delay line configured to delay a source clock signal by a delay amount to output a delayed clock signal, the delay amount varying in response to a first control signal;
    a second delay line configured to delay the delayed clock signal by a constant delay amount or a variable delay amount according to an locking state of the first delay line to output a feedback clock signal, the variable delay amount varying in response to a second control signal;
    a phase comparator configured to compare the phase of the source clock signal with the phase of the feedback clock signal; and
    a controller configured to control operations of the first and second delay lines by outputting the first and second control signals in response to an output signal of the phase comparator,
    wherein the variable delay amount varies from zero to a minimum delay time corresponding to a delay time obtained by subtracting the delay amount for locking the first delay line from a time corresponding to a period of the source clock signal.

12. The DLL of claim 11, wherein, before the locking state of the first delay line, the second delay line delays the delayed clock signal by the constant delay amount corresponding to a delay amount obtained by modeling a delay amount of an internal circuit of the semiconductor integrated circuit.

13. The DLL of claim 11, wherein, after the locking state of the first delay line, the second delay line delays the delayed clock signal by the variable delay amount varying corresponding to the comparison result of the phase comparator.

* * * * *